June 13, 1972 T. R. ALLINGTON 3,669,733

METHOD OF MAKING A THICK-FILM HYBRID CIRCUIT

Filed Dec. 12, 1969

INVENTOR.
TREVOR R. ALLINGTON
BY
W. S. Hill
Agent

United States Patent Office 3,669,733
Patented June 13, 1972

3,669,733
METHOD OF MAKING A THICK-FILM HYBRID CIRCUIT
Trevor Richard Allington, Indianapolis, Ind., assignor to RCA Corporation
Filed Dec. 12, 1969, Ser. No. 884,629
Int. Cl. H01c 7/00, 17/00; B44d 1/18
U.S. Cl. 117—212 3 Claims

ABSTRACT OF THE DISCLOSURE

A transparent, screen-printable insulation composition for protecting components of a hybrid integrated circuit comprising a transparent synthetic resin, mica flake and resin solvent in such proportions as to be screen-printable. Also, a method of making a hybrid integrated circuit in which passive components are trimmed after the protective coating is applied.

BACKGROUND OF THE INVENTION

Hybrid miniaturized circuits have found widespread use throughout the electronics industry. In this type of circuit, a pattern of circuit interconnections is usually deposited on an insulating substrate, such as a ceramic plate. Various passive circuit components such as resistors, capacitors and inductors may be mounted on the substrate as separate discrete units. Alternatively, these components may be formed by screening or other type of printing of dielectric materials, good conducting films, or resistive films, as the component requires, directly on the substrate. Active components such as transistors and diodes may also be included in these circuits.

The type of circuit component which is printed as a single film or as a plurality of superimposed films, on a substrate, usually requires some kind of protective medium to stabilize it against the effects of atmospheric and other environmental influences. If the entire circuit is to be hermetically sealed within a single container, this requirement may not be present. But where the substrate is a few square inches, or larger, in area, a good hermetic seal is very difficult or almost impossible to achieve at low cost. It is therefore necessary to place a protective coating on each individual component or on the circuit over-all.

Previously, the protective coating has usually comprised a synthetic resin such as a phenolic modified silicone resin, loaded with pigment. Such pigments have been relied on to impart suitable thixotropic properties to the compositions. These coatings have been satisfactory in providing protection against the environment. However, they have been opaque and therefore it has not been possible to make any mechanical adjustments to the circuit components after the protective coating has been applied. This has often been unsatisfactory because it is usually necessary to adjust the value of a resistor or capacitor after it is deposited. It is usually most desirable to make this adjustment after the protective coating has been applied and cured, since heat curing of the coating usually causes a change in the resistance value.

OBJECTS OF THE INVENTION

A principal object of the present invention is to provide a screen-printable insulation coating composition which is transparent.

A further object of the invention is to provide an improved method of adjusting the value of film type passive circuit components in miniaturized hybrid circuits.

THE DRAWING

DESCRIPTION OF PREFERRED EMBODIMENT

Example

Figure 1:
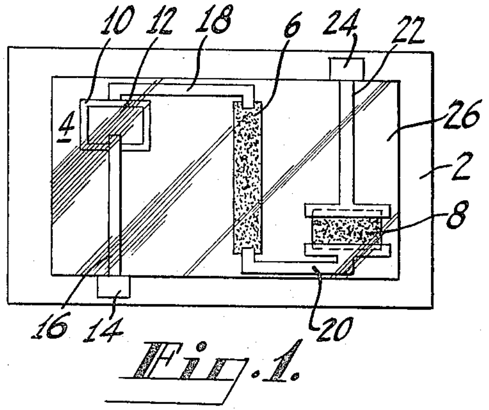
FIG. 1 is a top plan view of a part of a hybrid integrated circuit with several passive components.
Figure 2:
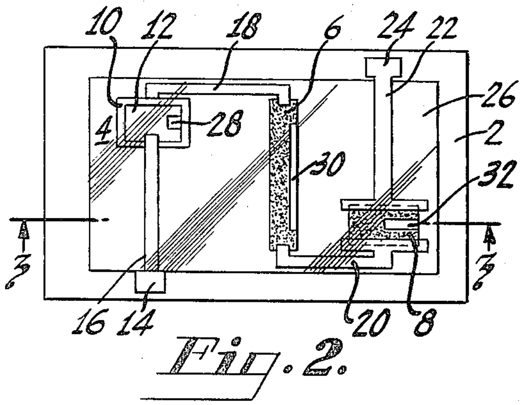
FIG. 2 is a view similar to that of FIG. 1 after the components are trimmed.
Figure 3:
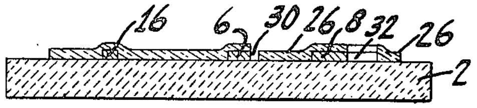
FIG. 3 is a section view taken along the line 3—3 of FIG. 2.

A composition in accordance with the present invention may comprise:

Silicone resin (DC805 of Dow Corning Corp.): 100 gms.
Mica Flake (FF325 English Mica Co.—Kings Mtn., N.C., high purity grade capable of passing through a 325 mesh screen): 50 gms.
Butyl carbitol acetate (solvent for the resin): 50 gms.
Wetting agent (DC FS 1265/1000 of Dow Corning Corp.) a fluorocarbon silicone oil: .04 ml.

The composition is prepared by thoroughly milling the ingredients.

The mica flake and the solvent may each be varied in the same proportion between about 50 gms. and 10 gms. per 100 gms. of resin. That is, the solvent is usually in about the same ratio by wt. to the resin as the mica flake is to the resin. The mica flake should be a high purity grade free from alkali impurities.

Silicone resins are preferred in these compositions for several reasons. Epoxy resin encapsulants over the silicone resin coating are often used for more complete mechanical as well as atmospheric protection for hybrid circuits. Silicone resins do not adhere well to epoxies. Therefore, expansion and contraction do not cause the components to be torn away from the ceramic substrate.

Other synthetic resins may be used in place of the silicone resins. Examples are diallyl phthalate, epoxies, polyimides and polyurethanes. The resin must be of a type that does not change color or opacity with age.

The particular wetting agent used is not critical. Its function is to prevent bubble formation in the protective coating. The amount used may be between about 0.01 ml. and about 0.1 ml. per 100 gms. of resin. The wetting agent specified in the above example has a viscosity of 1000 centistokes. Viscosities of 10 to 10,000 centistokes are suitable.

The solvent may be any conventional solvent for the particular synthetic resin used.

The compositions of the invention may be utilized in an improved method of making hybrid integrated circuits. The drawing illustrates only a portion of a typical circuit which may include a ceramic substrate 2 having disposed thereon a capacitor 4, and resistors 6 and 8. The capacitor 4 includes a bottom electrode (not shown) which is a metal film composed of silver and palladium particles and a glass frit, deposited on the ceramic substrate. On top of the bottom electrode is a dielectric film 10 which may be composed of a mixture of alkaline earth metal titanates and glass frit. Superimposed on the dielectric film 10 is a top metal electrode 12 which may have the same composition as the bottom electrode. All of these films are fired at about 1000° C. in forming them.

The resistor 6 is an elongated film composed of a screened-on composition of silver and palladium, palladium oxide and glass frit. Compared to the more highly conductive composition of the capacitor plates, which may contain a small proportion of palladium oxide in addition to the metals, the resistor has more oxide and a higher proportion of glass frit.

The resistor 8 is proportioned such that its width is greater than its length. It has the same composition as the resistor 6.

The top electrode 12 of the capacitor 4 is connected to a soldered connection terminal 14 with a metal film lead 16. The bottom terminal of the capacitor is connected to one end of the resistor 6 with a metal film lead 18. The other end of the resistor 6 is connected to one end of the resistor 8 with a metal film lead 20, and a metal film lead 22 connects the other end of a resistor 8 with a soldered terminal 24.

All of the circuit components and leads are covered with a coating 26 of the improved composition of the invention, for instance the composition of the example. The coating may preferably be 0.5 to 1.0 mil thick, or thicker if more than one coat is used. The coating is screened on and then cured for 2 hours at 150° C., or ½ hour at 250° C.

The circuit components may now be safely trimmed without several of the disadvantages attendant upon previous methods. The capacitor 4 may be adjusted to a lower value of capacitance by directing a stream of abrasive grit against a part of the coating 26 which overlies electrode 12. A small sector of the coating 26 is eroded away and then a corresponding sector of electrode 12 is eroded away leaving an opening 28 therein. Care is taken not to abrade through the dielectric layer 10 to avoid the possibility of metal from the top electrode shorting out the bottom electrode.

In a similar way a strip along one edge of resistor 6 is abraded away to increase its resistance as needed. This leaves an opening 30 in this component. And an opening 32 is formed in resistor 8 by abrading away a portion of its material. The amount of resistance material removed of course depends upon how much the resistance must be raised to meet the required value. Sometimes no adjustment at all is needed since the resistance is the correct value as deposited. But, at present, this is the exception rather than the rule.

A principal advantage of the method of the present invention is that the trimming step is not carried out until after the protective coating is applied and cured. When this sequence of steps can be followed, all heating operations take place prior to trimming and the trimming step can be carried out to closer tolerances with little or no danger of changes occurring after the trimming step has been completed.

An additional advantage of trimming the resistor after the protective coating is applied rather than before it is applied is that sand from the abrading jet cannot rebound and embed itself in some other part of the ceramic substrate. Before the coating is applied, grit can be deposited almost anywhere on the substrate during the abrading process and this later causes trouble in the encapsulation covering.

If the circuit is not to be further encapsulated or hermetically contained, the openings that have been formed can be filled with more of the transparent protective coating. However, in many cases, the unit will be further encapsulated in a resin, such as an epoxy or a polyurethane resin, for protection against mechanical shock and abrasion as well as atmospheric moisture. In this case there is no need to fill in the openings made during the trimming process, prior to encapsulation.

Trimming methods other than grit jet abrasion may be used in the present method. Laser beam trimming and also electron beam trimming may also be used, for example.

What is claimed is:

1. A method of making a thick-film hybrid circuit of the type comprising a ceramic substrate having components disposed thereon including at least one resistor composed of a layer of metallic particles and binder, and/or at least one capacitor having metal film electrodes, said method comprising in sequence:

covering by screen printing at least said resistor or said capacitor with a curable coating composition comprising a transparent silicone resin, mica flake and a solvent for said resin, curing said resin, adjusting the value of said resistor, or capacitor, by removing a portion thereof, and further encapsulating said circuit in either an epoxy resin or a polyurethane resin.

2. A method according to claim 1 in which said adjusting is done using a stream of abrasive particles.

3. A method according to claim 1 in which said adjusting is done with a laser beam.

References Cited

UNITED STATES PATENTS

| | | | |
|---|---|---|---|
| 3,546,009 | 12/1970 | Schneble, Jr. et al. | 117—212 |
| 3,423,517 | 1/1969 | Arrhenius | 117—212 X |
| 3,456,170 | 7/1969 | Hatch | 117—8 X |
| 3,330,696 | 7/1967 | Ullery, Jr. et al. | 117—212 |
| 3,206,342 | 9/1965 | Briggs | 117—212 X |
| 3,388,464 | 6/1968 | Pretty | 117—212 X |
| 3,394,386 | 7/1968 | Weller et al. | 29—610 X |
| 2,568,004 | 9/1951 | Heyman | 117—160 BX |
| 2,809,952 | 10/1957 | Bolson | 117—106 BX |
| 2,997,776 | 8/1961 | Matter et al. | 117—106 BX |
| 3,254,282 | 5/1966 | West | 117—218 X |
| 3,560,256 | 2/1971 | Abrams | 117—215 X |

OTHER REFERENCES

Clark, F. M., Insulating Materials for Design and Engineering Practice, John Wiley & Sons, New York, 1962, p. 1130.

ALFRED L. LEAVITT, Primary Examiner

K. P. GLYNN, Assistant Examiner

U.S. Cl. X.R.

29—620; 117—8, 216, 218